(12) United States Patent
Daniel et al.

(10) Patent No.: US 8,748,242 B2
(45) Date of Patent: Jun. 10, 2014

(54) ELECTRONIC CIRCUIT STRUCTURE AND METHOD FOR FORMING SAME

(75) Inventors: Jurgen H. Daniel, San Francisco, CA (US); Ana Claudia Arias, Los Gatos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/559,272

(22) Filed: Jul. 26, 2012

(65) Prior Publication Data
US 2012/0302046 A1 Nov. 29, 2012

Related U.S. Application Data

(62) Division of application No. 12/324,304, filed on Nov. 26, 2008, now Pat. No. 8,253,174.

(51) Int. Cl.
*H01L 21/336* (2006.01)

(52) U.S. Cl.
USPC ..... 438/161; 438/155; 438/158; 257/E21.414

(58) Field of Classification Search
USPC .................. 438/155, 158, 161; 257/E21.414
See application file for complete search history.

(56) References Cited

U.S. PATENT DOCUMENTS

| | | | |
|---|---|---|---|
| 5,574,294 A | 11/1996 | Shepard | |
| 6,274,412 B1 | 8/2001 | Kydd et al. | |
| 6,380,011 B1 | 4/2002 | Yamazaki et al. | |
| 7,151,275 B2 | 12/2006 | Klauk et al. | |
| 7,189,663 B2 | 3/2007 | Bao et al. | |
| 7,557,891 B2 | 7/2009 | Yoon | |
| 7,622,738 B2 * | 11/2009 | Oh et al. | 257/59 |
| 7,675,067 B2 | 3/2010 | Song et al. | |
| 2005/0151820 A1 * | 7/2005 | Sirringhaus et al. | 347/107 |
| 2006/0115945 A1 * | 6/2006 | Chabinyc et al. | 438/232 |
| 2006/0273303 A1 | 12/2006 | Wu et al. | |
| 2007/0066080 A1 | 3/2007 | Kugler et al. | |
| 2007/0138462 A1 * | 6/2007 | Street et al. | 257/40 |
| 2007/0158644 A1 | 7/2007 | Chabinyc et al. | |
| 2007/0252229 A1 * | 11/2007 | Fujimori et al. | 257/489 |
| 2008/0092807 A1 * | 4/2008 | Chabinyc et al. | 118/73 |
| 2009/0159875 A1 * | 6/2009 | Chabinyc et al. | 257/40 |
| 2009/0166612 A1 | 7/2009 | Cain et al. | |
| 2010/0006826 A1 | 1/2010 | Dimmler | |
| 2010/0099220 A1 * | 4/2010 | Street et al. | 438/107 |
| 2010/0127268 A1 * | 5/2010 | Daniel et al. | 257/66 |
| 2010/0127269 A1 | 5/2010 | Daniel et al. | |
| 2012/0307569 A1 * | 12/2012 | Kamath et al. | 365/185.29 |

OTHER PUBLICATIONS

A Salleo et al., "Polymer thin-film transistors with chemically modified dielectric interfaces," Applied Physics Letters, vol. 81, No. 23, pp. 4383-4385, Dec. 2, 2002.

Ping Liu et al., "Enabling Gate Dielectric Designe for All Solution-Processed, High-Performance Flexible Organic Thin-Film Transistors," J. Am. Chem. Soc., 128, pp. 4554-4555, 2006.

Garciella B. Blanchet et al., "Contact resistance in organic thin film transistors," Applied Physics Letters, vol. 84, No. 2, pp. 296-298, Jan. 12, 2004.

Ioannis Kymissis et al., "High-Performance Bottom Electrode Organic Thin-Film Transistors," IEEE Transactions on Electron Devices, vol. 48, No. 6, pp. 1060-1064, Jun. 2001.

* cited by examiner

*Primary Examiner* — Victor A Mandala
(74) *Attorney, Agent, or Firm* — Fay Sharpe LLP

(57) ABSTRACT

A thin film transistor (TFT) structure is implemented. This embodiment is much less sensitive than conventional TFTs to alignment errors and substrate distortion. In such a configuration, there is no need to define gate features, so the layout is simplified. Moreover, the gate layer may be patterned by several inexpensive printing or non-printing methods.

3 Claims, 7 Drawing Sheets

ELECTRONIC CIRCUIT STRUCTURE AND METHOD FOR FORMING SAME

This application is a divisional of and claims priority to U.S. application Ser. No. 12/324,304, filed Nov. 26, 2008 now U.S. Pat. No. 8,253,174, which is hereby incorporated herein by reference.

CROSS REFERENCE TO RELATED PATENTS AND APPLICATIONS

This application is related to U.S. application Ser. No. 12/324,207, filed on Nov. 26, 2008, entitled, "Thin Film Transistors and High Fill Factor Pixel Circuits and Methods for Forming Same," and naming Daniel et al. as inventors and U.S. application Ser. No. 12/324,250, filed on Nov. 26, 2008, entitled, "Method and Structure for Establishing Contacts in Thin Film Transistor Devices," naming Daniel et al. as inventors.

BACKGROUND

Typically, thin film transistor or active-matrix pixel circuits require careful alignment of the source-drain layer(s) to the gate layer. However, aligning layers in printed (organic) electronic circuits is a challenge, particularly on flexible substrates where substrate distortion and shrinkage often occur. It is difficult to compensate for such deformation of the substrate. This has significance because misalignment can lead to a non-working transistor.

To attempt to solve the problem, wide gate features have been used to ensure the source-drain region overlaps with the gate region. This approach and resulting overlap, however, cause high and undesired parasitic capacitances.

To illustrate these problems, FIGS. 1(a)-(e) show the elements of a printed pixel array. Such an array is typically used in active-matrix backplanes for displays, image sensors or other sensor arrays. As shown, a gate layer 10 (FIG. 1(a)), having defined gate features, and a data layer 12 (FIG. 1(b)), with data lines and pixel pads, should be aligned so that the gate features end up underneath the channel region 14 to form a thin film transistor (TFT) 16 (FIG. 1(c)). As noted above, misalignment can lead to non-functioning TFTs (FIG. 1(d)). In this regard, the source s and gate g overlap; however, there is no overlap between the gate g and the drain d. Thus, the TFT will not function properly. If the gate feature is chosen to be wide to compensate for potential misalignment as alluded to above, then the excessive parasitic capacitance due to overlapping s/g or s/d regions can cause problems (e.g. feedthrough voltage in pixels or reduced switching speed of TFTs) (FIG. 1(e)). So, solutions to these problems are desired.

Self-aligned patterning methods—using, for example, backside exposure of photoresist—are used in photolithographic patterning methods. However, for electronic circuits patterned using printing methods, better solutions are desired.

INCORPORATION BY REFERENCE

U.S. application Ser. No. 12/324,207, filed on Nov. 26, 2008, entitled, "Thin Film Transistors and High Fill Factor Pixel Circuits and Methods for Forming Same," and naming Daniel et al. as inventors and U.S. application Ser. No. 12/324,250, filed on Nov. 26, 2008, entitled, "Method and Structure for Establishing Contacts in Thin Film Transistor Devices," naming Daniel et al. as inventors are incorporated herein by reference in their entirety.

BRIEF DESCRIPTION

In one aspect of the presently described embodiments, a thin film transistor device comprises a gate line patterned to extend in a first direction, a first dielectric layer formed over the gate line, a second dielectric pattern deposited on the first dielectric layer and defining a transistor channel region comprising the gate line, a conductive layer formed on the second dielectric pattern and in alignment with the second dielectric pattern, and, a semiconductor formed in the channel.

In another aspect of the presently described embodiments, the second dielectric pattern is oriented on the first dielectric layer in a direction substantially perpendicular to the gate line.

In another aspect of the presently described embodiments, the conductive layer is in alignment with the second dielectric pattern.

In another aspect of the presently described embodiments, the device is part of an active-matrix display backplane.

In another aspect of the presently described embodiments, the device is used in an image sensor.

In another aspect of the presently described embodiments, the first dielectric has a low surface energy.

In another aspect of the presently described embodiments, the second dielectric is a polymer or a composite of polymer and inorganic particles.

In another aspect of the presently described embodiments, the second dielectric is printed.

In another aspect of the presently described embodiments, the second dielectric has a high surface energy.

In another aspect of the presently described embodiments, the conductive layer is aligned on the second dielectric by fluidic pinning.

In another aspect of the presently described embodiments, the device comprises a pixel circuit.

In another aspect of the presently described embodiments, the device comprises a pixel capacitor printed over a portion of the gate line and a portion of the pixel pad.

In another aspect of the presently described embodiments, the dielectric in the region of the pixel capacitor is thin relative to a thickness of second dielectric features.

In another aspect of the presently described embodiments, the semiconductor is deposited from a solution.

In another aspect of the presently described embodiments, the semiconductor is jet-printed.

In another aspect of the presently described embodiments, the gate line includes a meandering shaped edge.

In another aspect of the presently described embodiments, the device is connected to at least one second transistor device to form at least one of an inverter, shift register, memory cell, latch circuit or amplifier circuit.

In another aspect of the presently described embodiments, the method comprises patterning a gate line on a substrate in a first direction, depositing a dielectric over the gate line, printing polymer features in a direction perpendicular to the first direction to form a channel comprising the gate line, forming a conductive layer on the polymer features, and, forming a semiconductor in the channel.

In another aspect of the presently described embodiments, the forming of the conductive layer comprises pinning.

In another aspect of the presently described embodiments, the method further comprises a pixel capacitor to connect a gate line with a selected portion of the polymer features.

In another aspect of the presently described embodiments, an active-matrix pixel circuit comprises an array of gate electrodes formed on a substrate, the gate electrodes shaped as substantially parallel stripes oriented in a first direction, a first dielectric layer formed over the gate electrodes, a second dielectric layer patterned on the first dielectric layer and defining transistor channel regions comprising the gate line, a conductive layer formed on the second dielectric layer and in alignment with the second dielectric pattern, and, a semiconductor formed in the channel.

In another aspect of the presently described embodiments, the second dielectric layer comprises a phase-change polymer.

In another aspect of the presently described embodiments, an active-matrix pixel circuit comprises an array of gate electrodes formed on a substrate, the gate electrodes shaped as substantially parallel stripes oriented in a first direction, a first dielectric layer formed over the gate electrodes, a second dielectric layer of a first thickness patterned on the first dielectric layer and defining transistor channel regions comprising the gate line, a third dielectric layer of a second thickness patterned on the first dielectric layer and defining a pixel capacitor region, a conductive layer formed on the second and third dielectric layer and in alignment with the second and third dielectric pattern, and, a semiconductor formed in the channel.

In another aspect of the presently described embodiments, at least one of the second dielectric layer and the third dielectric layer comprises a phase-change polymer.

In another aspect of the presently described embodiments, an active-matrix pixel circuit comprises an array of gate electrodes formed on a substrate, the gate electrodes having a meandering shaped separation with a substantially constant spacing between neighboring gate electrodes, a first dielectric layer formed over the gate electrode, a second dielectric layer patterned on the first dielectric layer and defining transistor channel regions comprising the gate line, a conductive layer formed on the second dielectric layer and in alignment with the second dielectric pattern, and, a semiconductor formed in the channel.

In another aspect of the presently described embodiments, the second dielectric layer comprises a phase-change polymer.

DETAILED DESCRIPTION

According to the presently described embodiments, a bottom-gate thin film transistor (TFT) structure is implemented. This embodiment is much less sensitive than conventional TFTs to alignment errors and substrate distortion. In such a configuration, there is no need to define narrow gate features, so the layout is simplified. Moreover, the gate layer may be patterned by several inexpensive printing or non-printing methods.

Examples of various forms of the presently described embodiments are shown in FIGS. 2-5. Both the method of fabrication and the resulting structure should be apparent from the following description. Further, it will be appreciated that other forms and techniques are contemplated by the teachings herein.

Figure 1A:
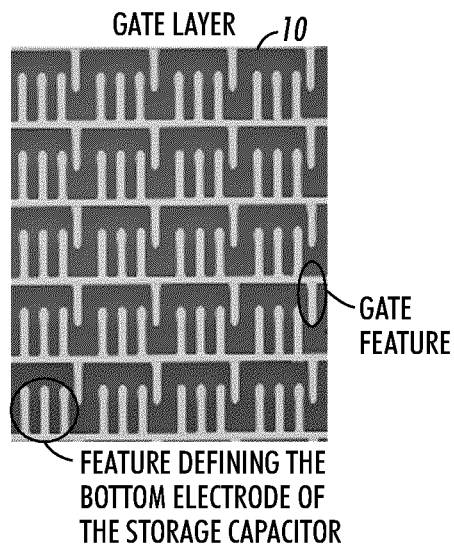
FIGS. 1(a)-(e) illustrate a configuration identifying a problem in the prior art.
Figure 1B:
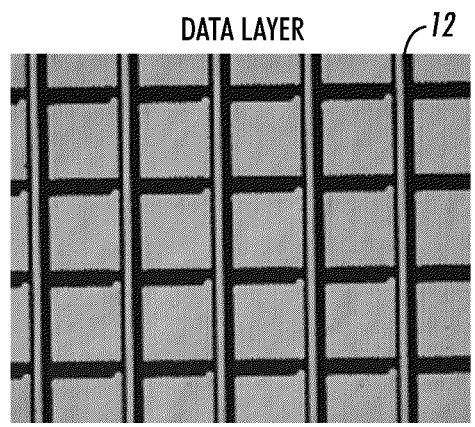
Figure 1C:
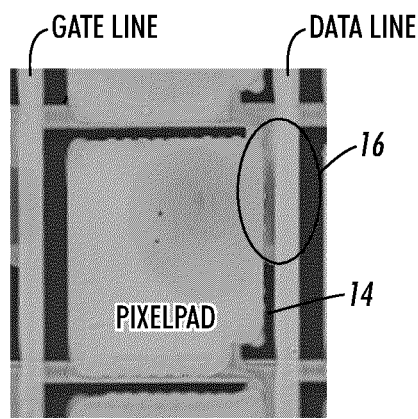
Figure 1D:
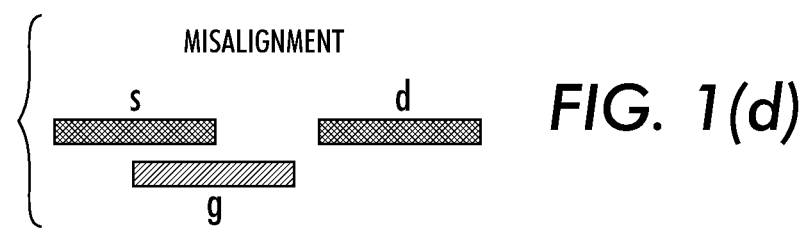
Figure 1E:
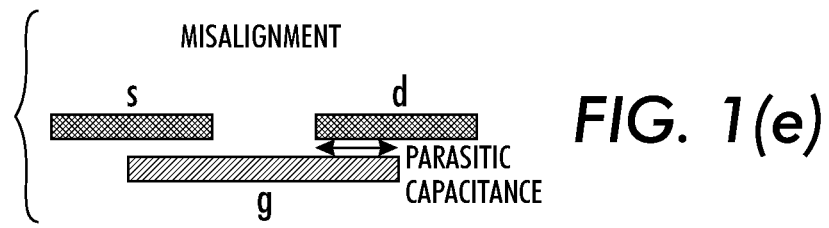
Figure 2A:
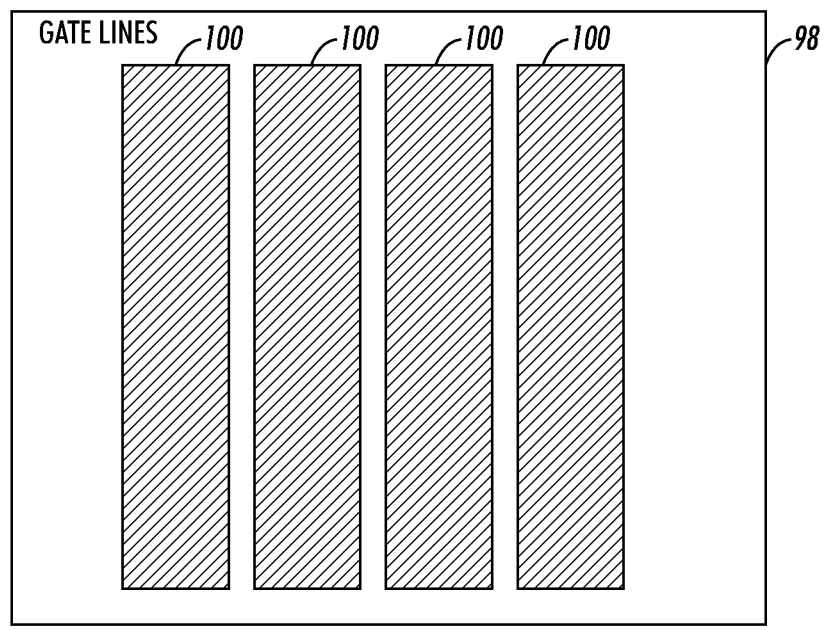
FIGS. 2(a)-(f) illustrate one of the presently described embodiments.

With reference to FIG. 2(a), in the formation of an active-matrix pixel circuit, a gate layer or area is patterned to form, for example, gate lines or a gate pattern using relatively simple shapes, such as lines or stripes 100. The gate layer is patterned on a suitable substrate 98, including polymer, metal, glass, ceramic, rigid or flexible substrates. Example materials are stainless steel foil, polyester foil (Mylar), polyethylene naphthalene (PEN) foil, FR4 printed circuit board, etc. Such patterning may be accomplished using a variety of techniques including printing, such as screen printing, ink-jet printing, offset-, gravure- or flexographic printing, extrusion-type deposition methods, laser-ablation, electrical erosion, scribing or etching of a continuous conducting layer or by evaporation through a shadow mask (e.g. a mask made from an array of parallel wires). It should be appreciated that continuous straight lines, as shown, are much easier to pattern than the small gate features such as those shown in FIG. 1(a). A characteristic of this gate line pattern may be the substantially constant spacing between the stripes which may be defined by e.g. the width of a laser beam, the sizeo a scribing stylus, the diameter of a wire (the latter in the case of a shadow mask).

Figure 2B:
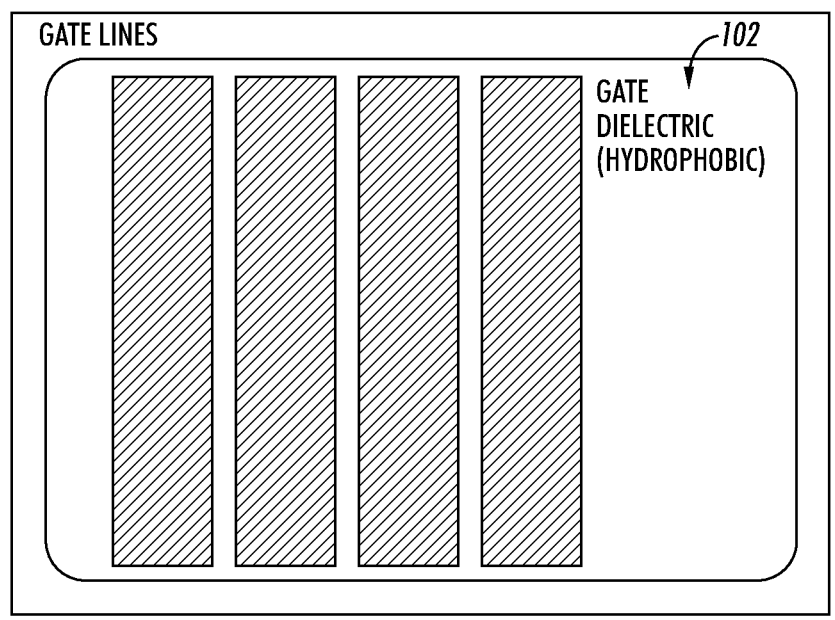

As shown in FIG. 2(b), a continuous first or gate dielectric layer or pattern 102 (e.g. a polymer dielectric insulator such as polyvinylphenol (PVP), poly(vinyl cinnamate), epoxide, polystyrene, PMMA, parylene, polyimide, spin-on-glass, an atomic layer deposited dielectric or a plasma deposited (PECVD) dielectric such as silicon dioxide or silicon nitride, etc.) is formed or deposited using any of a variety of known techniques. The dielectric layer may also be an organic-inorganic hybrid dielectric, a self assembled monolayer or a stack of self assembled monolayers such as the self-assembled superlattices (SAS) described by H. C. Lin et al. (Applied Physics Letters 89, 142101, 2006). Polymer dielectrics, for example, may be deposited by spin-coating, spray coating, extrusion, doctor-blading, dip-coating, evaporation or plasma deposition. The dielectric layer may also be selectively deposited over only the gate electrodes. This may be achieved by a selective binding process such as in the case of thiol molecules which selectively bind to a gold surface. The dielectric layer may also comprise multiple layers such as an oxide with a self assembled monolayer surface coating or a (polymer) dielectric with a polysilsesquioxane top layer. The function of the upper layer may be to change the surface energy of the gate dielectric or to smoothen the surface (decrease the surface roughness). In at least one form, this dielectric has a low surface energy which means it is hydrophobic. In one example of a hydrophobic surface, the water contact angle is above 80 degrees. In other examples, the water contact angle is above 70 or 90 degrees. A specific example of a hydrophobic dielectric would be a layer of plasma deposited silicon dioxide (e.g. 500 nanometers thick) with a hydrophobic octadecyltrichlorosilane (OTS) self-assembled monolayer coating. It should be noted that the gate dielectric layer does not necessarily have to be deposited, but it may also be grown from the gate metal In one example, a gate dielectric is grown on aluminum gate lines by oxidizing the surface of the aluminum to aluminum oxide in an oxidizing atmosphere such as ozone. In another example, a layer of tantalum oxide is grown on the surface of a tantalum gate electrode by anodization. Such surfaces may also be turned hydrophobic by a silane or silazane treatment, for example.

Figure 2C:
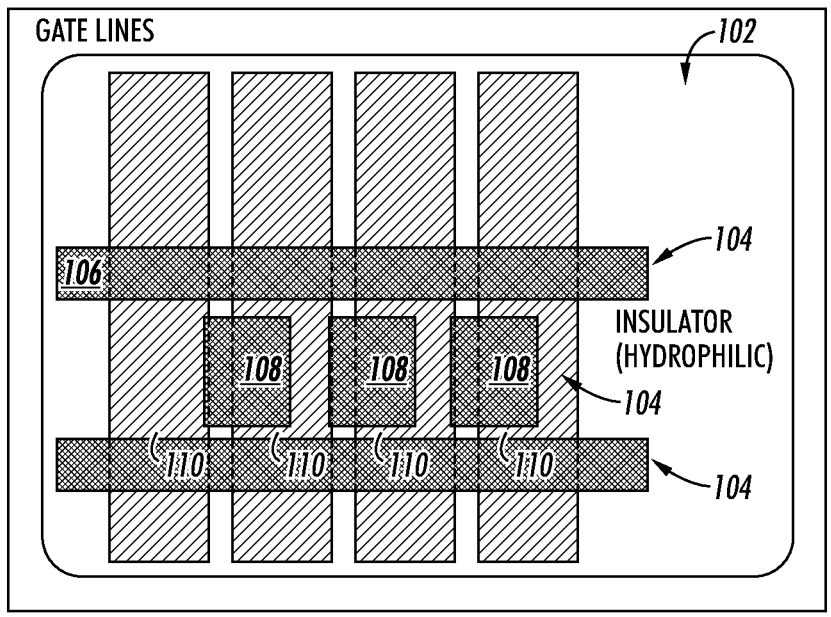

Referring now to FIG. 2(c), a pattern 104 (or plurality of features) formed of a second dielectric material is deposited. Of course, the second dielectric pattern 104 may be deposited in any of a variety of manners. For example, it may be deposited from a solution such as in a printing method or it may be deposited by evaporation through a shadow mask, or it may be coated (e.g. spin-coated) and patterned using conventional photolithography. If printing methods are used, a variety of printing techniques such as inkjet-, offset-, gravure-, flexographic-, aerosol-, screen- or extrusion-printing may be employed. In one embodiment, the pattern 104 may be a jet-printed polymer such as jet-printed PVP (polyvinylphenol), PVA (polyvinylalcohol) or it may be a jet-printed UV-curable (or more generally: radiation curable) polymer. In particular, it may be a printed phase-change material that is printed in a melted (liquid) state and solidifies upon cooling on the print surface. A wax or UV curable gels are example materials. A phase-change material may be also a radiation curable polymer such as a UV-curable polymer which can be instantly cured by radiation. For example, the phase-change polymer may be an inkjet printable UV curing ink, such as the HexiJet line of inks from Hexion Speciality Chemicals, Inc. Another specific example are radiation curable phase-change inks described in US Pat Appl. 20070142492. In another method, the polymer features are defined (definition may occur by stamping or microcontact printing) by first defining pinning regions for a polymer solution, and then coating the polymer so that it is retained only in the pinning regions This layer or pattern 104 may take a variety of configurations but, in at least one form, defines regions for data lines or areas 106 and pixel pads or areas 108. It also defines a length of a channel 110 for the transistor region of the device. As can be seen, the vertical alignment (parallel to the gate lines), which usually is very important in constructing these types of devices, is not a factor in this embodiment using gate-lines which are shaped as stripes or simple rectangles. In one embodiment, the pattern 104 (and in particular the data nes 106) is oriented substantially perpendicular to the gate lines 100.

The dielectric or polymer layer or pattern 104 serves to capacitively decouple the subsequent conductive traces of the data-layer from the gate-layer. The polymer may be a low-k polymer or it may be relatively thick (e.g., 0.5-5 microns). Particularly, also several layers may be printed in order to increase the total height. In one form, the polymer is hydrophilic (has a high surface energy). For example, a hydrophilic polymer used may have a water contact angle of less than 60 deg. A polymer such as polyvinylalcohol (PVA) or gelatin are examples.

Figure 2D:
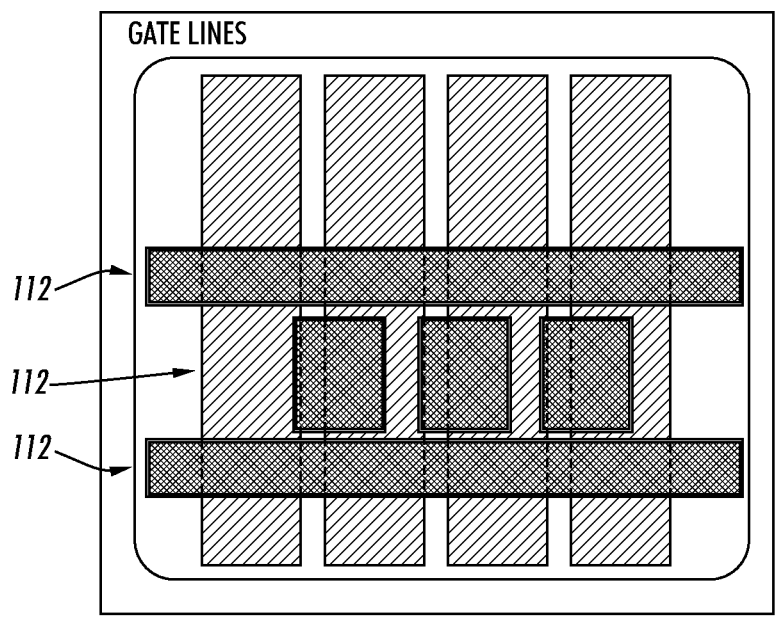

In FIG. 2(d), a conductive material is deposited over the regions of the previously deposited polymer, i.e., over the pattern 104. A variety of techniques may be used. For example, the material may be jet-printed (e.g. printed conducting polymer such as PEDOT:PSS [e.g. Clevios™ from H.C. Starck of Goslar, Germany], polyaniline, carbon nanotube solutions or silver nanoparticle solution). In this regard, the printed features are aligned to the previously printed polymer pattern. In one self-aligned deposition method, the polymer (or more generally, the dielectric material) of FIG. 2(c) acts as a fluidic pinning structure. Self-alignment is achieved by selective fluidic pinning on the pattern 104. One characteristic of a self-aligned layer 112 may be the almost ideal alignment with layer 104 with negligible lateral uneven offset between the structures 112 and 104 (however the structures of layer 112 may evenly laterally overhang the structures of layer 104). In this regard, fluid, such as PEDOT solution or solution of silver, gold, copper or nickel nanoparticles or solution of carbon nanotubes or graphene, is coated over the surface (e.g. by spin-coating, dip-coating or by a doctor-blading type method). This solution is only retained in the areas of the polymer, but it dewets from the surrounding areas. This effect can be achieved by having a hydrophilic (high surface energy) polymer printed on a hydrophobic (low surface energy) gate dielectric. Or, it may be accomplished using structural pinning. For example, if the patterned polymer surface is rough and the surrounding gate dielectric is smooth, the rough polymer may preferentially pin a liquid. The polymer may, therefore, contain micro or nanoparticles that would increase the roughness. Examples of such particles are titanium dioxide, silicon dioxide, zirconium oxide or aluminum oxide particles and also polymer particles and the shape of the particles may include wire, tube and belt shapes such as nanowires, nanotubes or nanobelts. Those particles may be embedded in a polymer such as PVA, for example. Moreover, a thin hydrophobic layer, such as a polysilsesquioxane, may be coated before depositing the conductor. See U.S. application Ser. No. 12/324,250, filed on Nov. 26, 2008, entitled, "Method and Structure for Establishing Contacts in Thin Film Transistor Devices," naming Daniel et al. as inventors, which is incorporated herein by this reference in its entirety. In the rough regions, the coating will form more pinholes and provide much better pinning than in the smooth regions. Notwithstanding the manner of deposition of the conductive material, after drying of the overcoated liquid, a patterned conductive layer or pattern 112 forms, as shown in FIG. 2(d). In the case of deposited silver nanoparticles, the layer typically requires a heating or photonic curing step in order to render the material conductive. It should be noted that the conductive layer 112 may be also deposited by an electroless plating method if the surface of the insulating pattern 104 carries a plating catalyst, for example.

Figure 2E:
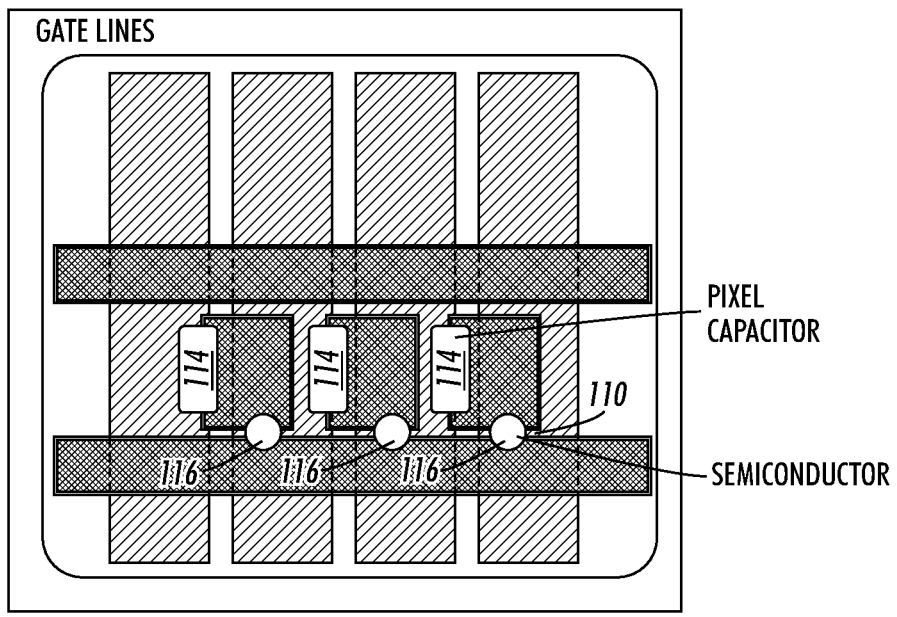
Figure 2F:
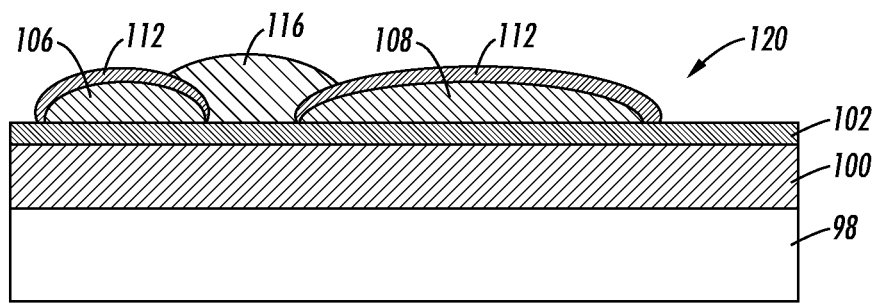

Afterwards, as shown in FIG. 2(e), additional conductive regions may be deposited to form storage or pixel capacitors 114. These conductive pixel capacitor regions 114 are printed to extend the pixel pads over the neighboring gate lines. These regions may be printed directly onto the underlying gate dielectric or they may be formed on a thin pinning layer. Such a thin pinning layer may comprise another polymer or of a thinner version of the dielectric material used to pattern the structures 104. For example, the layer may be only 10-500 nm thick. Similar dielectric materials as for layer 104 may be used, including phase-change polymers. Therefore, the regions 114 may also have been patterned before the conductive regions 112 have been deposited. In fact, the coating of conductive material shown in FIG. 2(d) may have also coated the regions 114 at the same time, as will be described in more detail in FIG. 3(a), Other forms of deposition or formation may also be employed. A semiconductor 116 is deposited as well. The semiconductor 116 is printed/deposited in the channel region 110. The semiconductor may be deposited in many ways, e.g. by jet-printing of polymer semiconductor solutions, or precursors (including pentacene, zinc oxide or silicon precursors, as well as carbon nanotubes, silicon nanowires or nanobelts, grapheme, silicon nano particles or other semiconducting nanoparticles, nanorods, nanoribbons, etc.). Before depositing these materials, the surface may be treated with a coating that improves the performance of the semiconductor, such as a hydrophobic coating that improves the molecular ordering of an organic semiconductor. A self-assembled monolayer such as OTS (octadecyltrichlorosilane) or triethyoxyphenylsilane or a polysilsesquioxane are examples. It should be noted that the semiconductor may also be deposited before depositing the layers 104 and/or 112. This would result in a configuration that is a top-contact (staggered) transistor.

FIG. 2(*f*) shows a cross-section of a TFT structure. The resulting structure 120 is formed on the substrate 98. The gate lines 100 have the dielectric layer 102 formed thereon. Also shown are the data line region 106 and the pixel pad region 108, which serve to define the source and drain, respectively, for the transistor. The metal conductive layer 112 and semiconductor 116 are also shown. It should be appreciated that the details of operation of the TFT will be apparent to those of skill in the art.

Figure 3A:
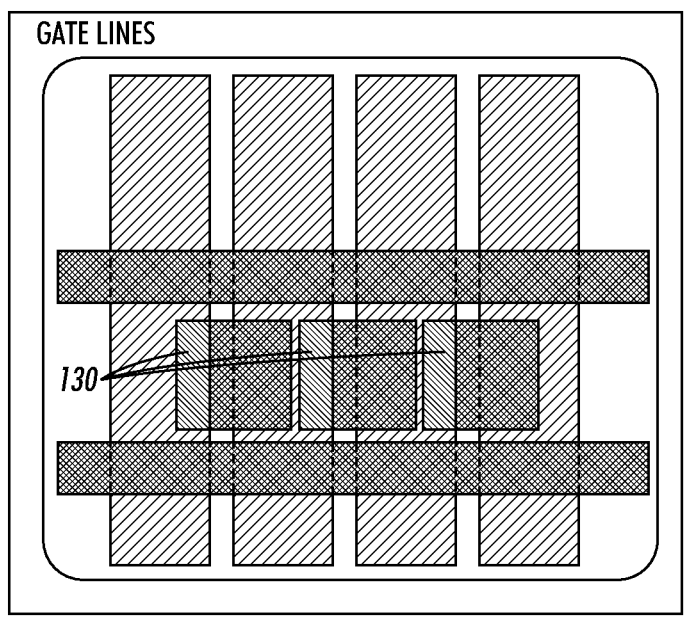
FIGS. 3(a)-(b) illustrate another of the presently described embodiments.
Figure 3B:
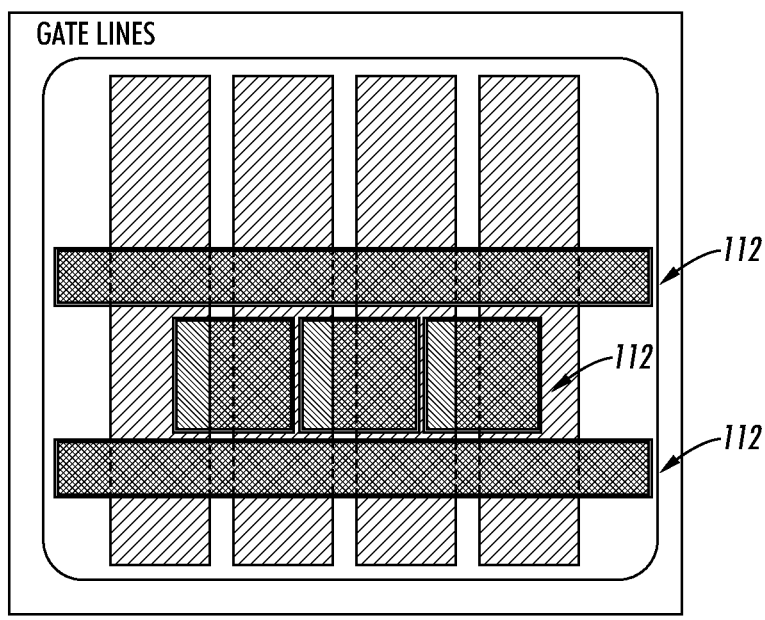

FIGS. 3(*a*) and (*b*) illustrate that the deposited dielectric layer 106, 108 may have various thickness (it is illustrated as a thinner layer in region 130). For example, polymers with different viscosity may be printed or varying numbers of layers may be printed in selected regions. The area of the pixel pad which defines the storage capacitor only desires a thin polymer layer. For example, a layer as thin as 10-100 nanometers or even less would be sufficient to modify the surface and create a region that later acts as structure to pin a fluid. The other areas need a thicker (e.g. 0.5-5 microns) dielectric to reduce capacitive coupling. The exact thickness values depend of course also very much on the dielectric constant of the deposited material.

So, alternative steps to steps in FIGS. 2(*c*) and 2(*d*) above, are used such that, in a region 130 defining the storage capacitor, a thin dielectric layer is deposited. In the other regions, a thicker dielectric layer. FIG. 3(*b*) simply shows that a conductive layer 112 may, likewise, be deposited over all such polymer regions. The conductive layer may be deposited in a self-aligned manner on the dielectric layers 106, 108 (and including region 130) by selective fluidic pinning.

Figure 4:
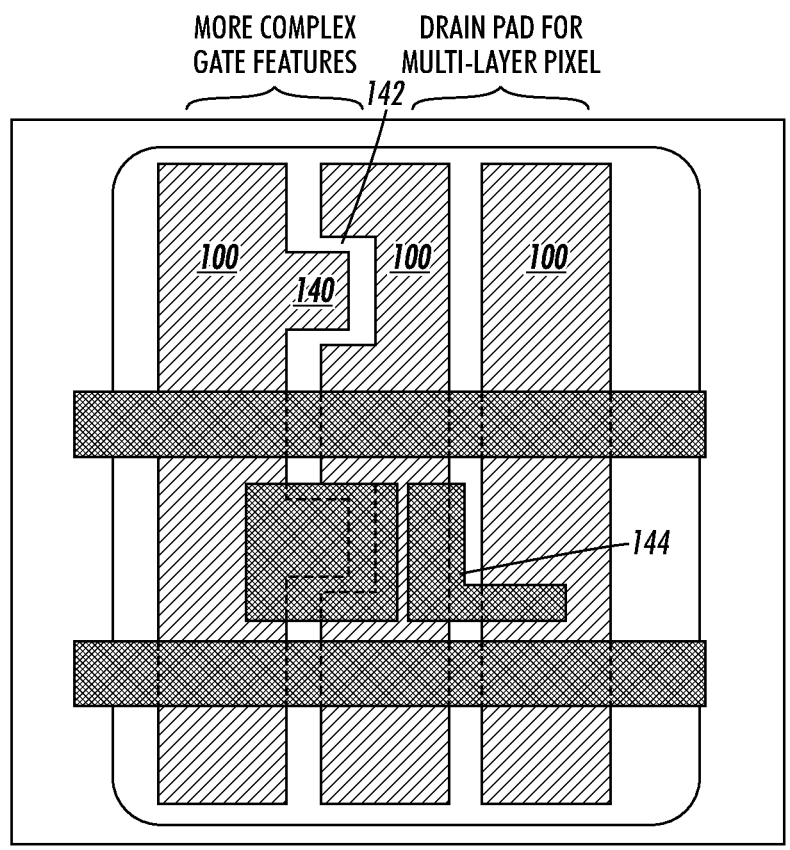
FIG. 4 illustrates still another of the presently described embodiments.

FIG. 4 illustrates that the gate layer may be patterned slightly more complex (e.g., irregularly shaped) than just straight lines in order to provide a bigger storage capacitor or to reduce capacitive coupling with the underlying gate line, for example. So, for example, the gate lines 100 may have alternating extensions 140 and corresponding notches 142 formed therein. This configuration would effectively increase the physical size of the storage or pixel capacitor by the area of the extension 142. This structure of the gate lines can be described as a meandering shaped separation between neighboring gate lines or as having a meandering shaped edge. The width of the meander spacing between neighboring gate lines would be again substantially constant as it would be defined by the width of a laser beam or the size of a scribing tool, etc. that defines the separation. It should be understood that these types of variations are a function of the design objectives for the circuit. However, in accordance with the teachings of the presently described embodiments, in at least one form, the gate line structure should still be of sufficient width so that precise alignment is less critical than for structures that have been heretofore known.

Moreover, the drain or pixel pad area 144 may have a geometry that reduces capacitive coupling to the gate line. In this regard, the area of the drain pad may be smaller for multi-layer pixel circuits. This geometry may be particularly suited if a multi-layer pixel structure (with, for example, a mushroom metal layer over another dielectric layer with via interconnects to area 144) is used.

Figure 5:
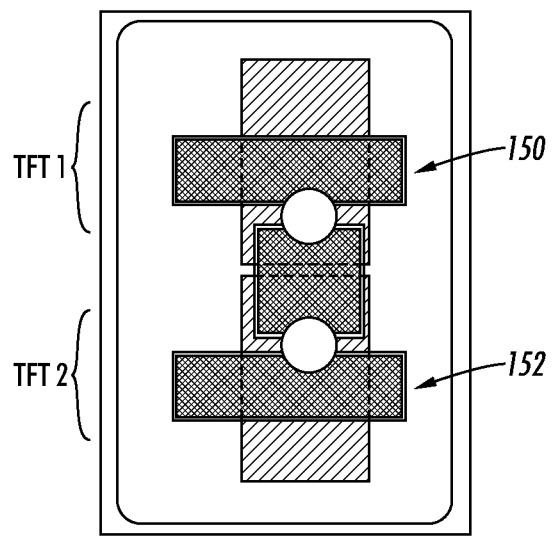
FIG. 5 illustrates still another of the presently described embodiments.

FIG. 5 illustrates a further embodiment. Two transistors 150 and 152 may be connected as part of an electronic circuit, e.g., as an inverter circuit. Here again, the gate feature is wide and the source/drain capacitive coupling to the gate area is reduced by printed dielectric layers. Using this fabrication method various electronic circuits, such as shift registers, memory cells, latch circuits, amplifier circuits, etc. may be built. Of course, other configurations may also be implemented.

In accordance with the presently described embodiments, it should be understood that, experimentally, the parasitic capacitance is reduced. For example, by adding a 1 micron polymer layer (having an approximate dielectric constant of 3) over a gate dielectric with a capacitance of 14 nF/cm2, the capacitance is reduced to 2.2 nF/cm2.

It should be further understood that experiments evidence that the selective pinning of a polymer conductor (e.g., Baytron HC PEDOT) to an underlying hydrophilic polymer line is realizable. A solution of VO5 polymer (containing ethyl ester of PVM/MA copolymer, aminomethyl propanol, diisopropyl adipate, triethyl citrate, dimethicone copolyol) of Alberto-Culver USA, Inc., Melrose Park, Ill., in polyethylene glycol (PEG) was dispensed in the form of a straight line onto a hydrophobic substrate with a fiber by a dip-pen method. After the solvent dried off, a drop of the PEDOT solution was drawn over the surface by means of another fiber. The PEDOT solution wetted to the hydrophilic polymer line, but it was repelled by the hydrophobic substrate. The results are conductive lines which are defined by the underlying VO5:PEG polymer (VO5 contains a PVM/MA copolymer, CAS Registry Number 009011-16-9). Here, the hydrophobic surface was a layer of methyl polysilsesquioxane (PSSQ).

The advantages of the presently described embodiments should be apparent. Nonetheless, one advantage is that gate-layer patterning is simple since, in at least one form, only lines or relatively simple dimensionally less critical structures need to be patterned. The patterning remains relatively simple for more complex gate configurations as well.

Another advantage is that less careful alignment between the gate-layer and the source-drain layer is required. Again, even where irregularly-shaped gate regions are implemented, alignment is a much simplified process as compared to heretofore known techniques. This results in a less expensive process.

It should also be understood that variations of the presently described embodiments are contemplated. For example, the presently described embodiments are illustrated in an environment and a structure that is typically used in active-matrix backplanes. However, the techniques and structures of the presently described embodiments apply to individual transistors or transistor circuits in general. Also, the presently described embodiments are not limited to an all-printed patterning approach. Photolithographic patterning approaches may also take advantage of these techniques.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method for forming a thin film transistor, the method comprising:
   patterning a gate line on a substrate in a first direction;
   depositing a dielectric over the gate line;
   printing polymer features in a direction perpendicular to the first direction to form a channel comprising the gate line;
   forming a conductive layer on the polymer features; and,
   forming a semiconductor in the channel.

2. The method as set forth in claim 1 wherein the forming of the conductive layer comprises pinning.

3. The method as set forth in claim 1 further comprising a pixel capacitor to connect a gate line with a selected portion of the polymer features.

* * * * *